United States Patent
Yang

(10) Patent No.: US 8,860,600 B1
(45) Date of Patent: Oct. 14, 2014

(54) SUCCESSIVE-APPROXIMATION-REGISTER ANALOG-TO-DIGITAL CONVERTER FOR PROGRAMMABLY AMPLIFYING AMPLITUDE OF INPUT SIGNAL AND METHOD THEREOF

(71) Applicant: Realtek Semiconductor Corp., HsinChu (TW)

(72) Inventor: Jun Yang, Jiangsu (CN)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/962,437

(22) Filed: Aug. 8, 2013

(30) Foreign Application Priority Data

Apr. 28, 2013 (CN) .............................. 201310156698

(51) Int. Cl.
*H03M 1/46* (2006.01)
*H03M 1/12* (2006.01)

(52) U.S. Cl.
CPC .............. *H03M 1/124* (2013.01); *H03M 1/466* (2013.01); *H03M 1/12* (2013.01)
USPC ........... 341/172; 341/150; 341/155; 341/160; 341/170

(58) Field of Classification Search
CPC ......... H03M 1/12; H03M 1/68; H03M 1/122; H03M 1/0656; H03M 1/0682; H03M 1/804; H03M 1/468; H03M 1/466
USPC .................................................. 341/150–172
See application file for complete search history.

(56) References Cited

U.S. PATENT DOCUMENTS

| | | | |
|---|---|---|---|
| 7,528,761 B2 * | 5/2009 | Draxelmayr ................... | 341/172 |
| 7,777,662 B2 * | 8/2010 | Meynants et al. .............. | 341/163 |
| 7,956,787 B2 * | 6/2011 | Westwick et al. .............. | 341/155 |
| 8,456,348 B2 * | 6/2013 | Kuo et al. ...................... | 341/172 |
| 8,547,270 B1 * | 10/2013 | Strode ............................ | 341/161 |
| 2004/0075601 A1 * | 4/2004 | Carreau et al. ................. | 341/172 |
| 2013/0015996 A1 * | 1/2013 | Furuta ............................ | 341/172 |

\* cited by examiner

*Primary Examiner* — Lam T Mai
(74) *Attorney, Agent, or Firm* — Muncy, Giessler, Olds & Lowe, P.C.

(57) ABSTRACT

Disclosed are a successive-approximation-register (SAR) analog-to-digital converter (ADC) for programmably amplifying an amplitude of an input signal and a method thereof. During a sampling phase, a bottom plate of at least one capacitor in a capacitor array is connected electrically to an input signal, so that the capacitor array samples and amplifies the input signal, so as to lower a required sampling capacitor or reduce noise generation.

21 Claims, 11 Drawing Sheets

US 8,860,600 B1

SUCCESSIVE-APPROXIMATION-REGISTER ANALOG-TO-DIGITAL CONVERTER FOR PROGRAMMABLY AMPLIFYING AMPLITUDE OF INPUT SIGNAL AND METHOD THEREOF

CROSS-REFERENCES TO RELATED APPLICATIONS

This non-provisional application claims priority under 35 U.S.C. §119(a) on Patent Application No. 201310156698.1 filed in China, P.R.C. on 2013/04/28, the entire contents of which are hereby incorporated by reference.

BACKGROUND

1. Technical Field

The present invention relates to a successive-approximation-register (SAR) analog-to-digital converter (ADC), and more particularly, to an SAR ADC for programmably amplifying amplitude of an input signal and a method thereof.

2. Related Art

An analog-to-digital converter (ADC) has multiple architectures, such as a flash ADC, a pipelined ADC and a successive-approximation-register (SAR) ADC. Each architecture has its own advantages and is generally selected according to different application requirements. In comparison with other architectures, the SAR ADC consumes less power, while occupying smaller area and incurring a lower cost.

The operation of the SAR ADC starts from a sampling phase. During the sampling phase, a sample-and-hold (S/H) circuit samples and accesses an analog input signal. Next, the SAR ADC enters a bit-cycling phase (bit-cycling phase), to decide transformation output of a digital code.

An N-bit SAR ADC generally includes an S/H circuit, an N-bit digital-to-analog converter (DAC), a voltage comparator and an SAR control circuit.

An input voltage provides a stable voltage to the voltage comparator through the S/H circuit, and the voltage comparator compares the stable voltage with an output voltage of the N-bit DAC. The SAR control circuit controls an output of the N-bit DAC by using a binary search algorithm.

The S/H circuit and the N-bit DAC are generally implemented by a capacitive DAC formed by a capacitor array. The SAR control circuit adjusts the output of the N-bit DAC by controlling switching of a switch element in the capacitive DAC.

In order to suppress power supply noise and common-mode noise, a common SAR ADC adopts a full differential structure. There mainly exist two types of common SAR ADCs with the full differential structure: one performs sampling by adopting a top plate, and the other performs sampling by adopting a bottom plate. That is to say, during the sampling phase, the top plates of the capacitor array are coupled to an input signal or the bottom plates of the capacitor array are coupled to an input signal, so as to sample the input signal.

Due to limitation of sampling noise (KT/C noise), of a capacitor, the size of a sampling capacitor of the SAR ADC is generally inversely proportional to the square of the amplitude of the input signal. Consequently, if the amplitude of the input signal can be increased, the size of the sampling capacitor may be greatly reduced. In the prior art, a programmable gain amplifier (PGA) is mainly used to amplify the amplitude of the input signal, but the PGA itself occupies the area of a chip, and contributes extra noise.

SUMMARY

In an embodiment, a successive-approximation-register (SAR) analog-to-digital converter (ADC) for programmably amplifying amplitude of an input signal includes a first node, a second node, a third node, a fourth node, a fifth node, a comparator, an SAR control circuit, a selection module and a capacitor module. The selection module includes a plurality of first switching units UA1, UA2-UA(N−1), a plurality of second switching units UB1, UB2-UB(N−1), a first switch SW1 and a second switch SW2. The capacitor module 170 includes a plurality of first capacitors CA1, CA2-CA(N−1), and a plurality of second capacitors CB1, CB2-CB(N−1).

The first node is used to receive one of a differential input signal, the second node is used to receive the other one of the differential input signal, the third node is used to receive a positive reference voltage, the fourth node is used to receive an negative reference voltage, and the fifth node is used to receive a common-mode voltage.

The SAR control circuit is coupled to an output terminal of a comparator and generates a first control signal, a second control signal and a digital signal according to an output of the comparator. Here, the first switching units are controlled by the first control signal, and the second switching units are controlled by the second control signal.

The first switch is coupled between a first input terminal of the comparator and the first node, and the second switch is coupled between a second input terminal of the comparator and the second node.

The first capacitors are respectively corresponding to the first switching units and coupled between the first input terminal of the comparator and the corresponding first switching unit. Each first capacitor is coupled to the third node, the fourth node and the fifth node through the corresponding first switching unit, and at least one first capacitor is further coupled to the second node through the corresponding first switching unit.

The second capacitors are respectively corresponding to the second switching units and coupled between the second input terminal of the comparator and the corresponding second switching unit. Each second capacitor is coupled to the third node, the fourth node and the fifth node through the corresponding second switching unit.

In an embodiment, an SAR analog-to-digital conversion method for programmably amplifying amplitude of an input signal includes: sequentially executing a sampling phase, a holding phase and a bit-cycling phase.

The sampling phase includes: sampling one of a differential input signal by using top plates of a plurality of first capacitors in a capacitor module, sampling the other one of the differential input signal by using a bottom plate of at least one first capacitor of the first capacitors, and sampling the other one of the differential input signal by using top plates of a plurality of second capacitors in the capacitor module. The second capacitors are respectively corresponding to the first capacitors.

The holding phase includes: disconnecting the top plates of the first capacitors and the second capacitors from the differential input signal, and setting the bottom plates of the first capacitors to be connected electrically to a common-mode voltage.

The bit-cycling phase includes: comparing a terminal voltage of the top plates of the first capacitors with a terminal voltage of the top plates of the second capacitors by using a comparator; switching, sequentially according to an output of the comparator, the bottom plate of one of the first capacitors and the bottom plate of the corresponding second capacitor from being connected electrically to the common-mode voltage into being respectively connected electrically to a differential reference voltage, and after each switching, comparing the terminal voltage of the top plates of the first capacitors with the terminal voltage of the top plates of the second capacitors by using the comparator again; and generating a digital signal according to the outputs of the comparator.

In some embodiments, the sampling phase further includes: sampling the one of the differential input signal by using the bottom plate of at least one of the second capacitors. The holding phase further includes: setting the bottom plates of the second capacitors to be connected electrically to the common-mode voltage.

To sum up, in the SAR ADC for programmably amplifying amplitude of an input signal and the method thereof according to the present invention, the top and bottom plates of the capacitors are used to perform sampling at the same time, so the amplitude of the input signal may be amplified at the same time, so that in consideration of noise in the same level, the required sampling capacitor is smaller, or for the same sampling capacitor, the brought noise is lower. Additionally, after being sampled, a pseudo-differential input signal is automatically converted into a full differential input signal, so as to suppress power supply noise and common-mode noise.

BRIEF DESCRIPTION OF THE DRAWINGS

The present invention will become more fully understood from the detailed description given herein below for illustration only, and thus not limitative of the present invention, wherein.

DETAILED DESCRIPTION

The following mentioned terms such as "first" and "second" are used to differentiate the referred elements, rather than sequencing or limiting the difference of the referred elements and rather than limiting the scope of the present invention.

Figure 1:
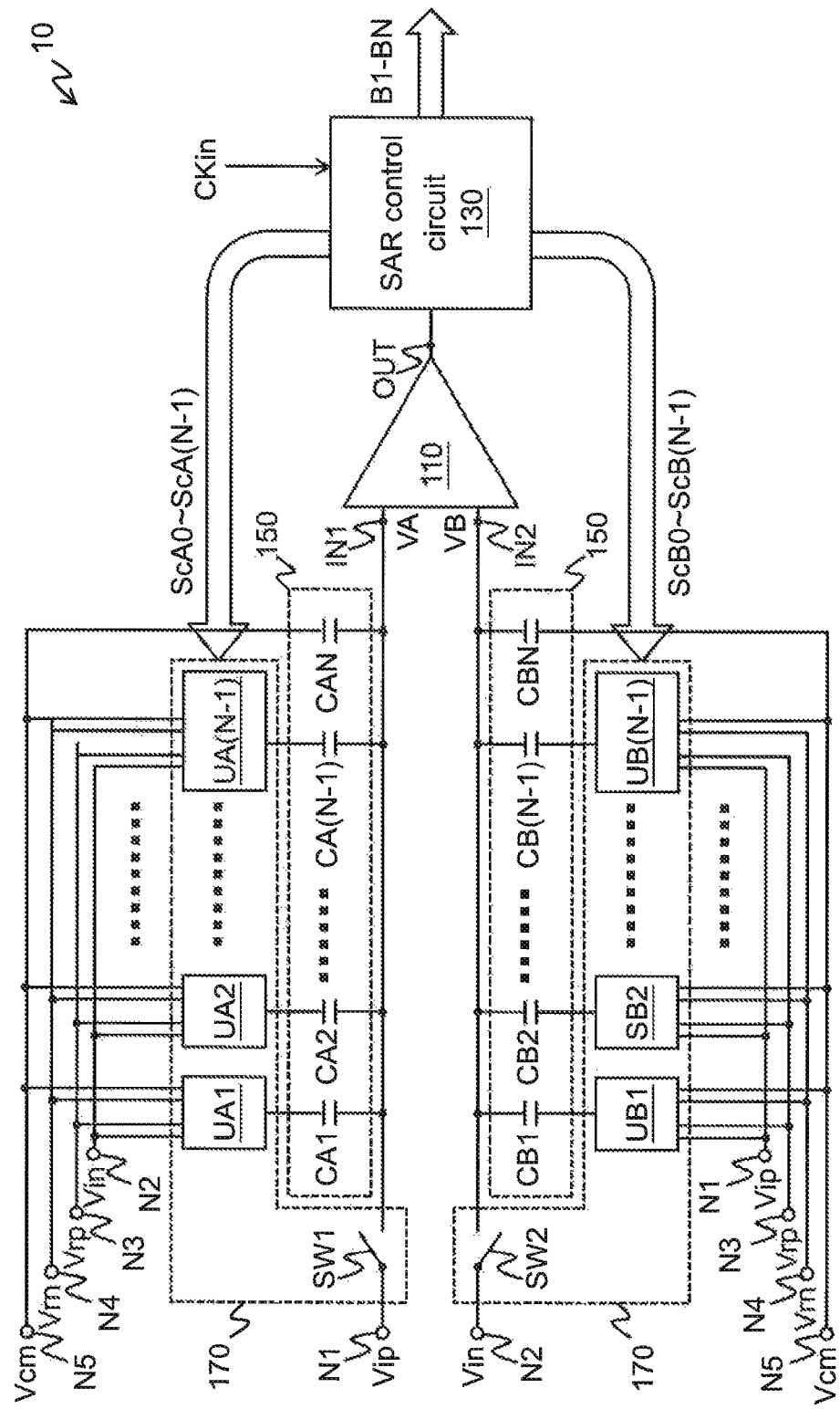
FIG. 1 is a schematic outline diagram of a successive-approximation-register (SAR) analog-to-digital converter (ADC) for programmably amplifying amplitude of an input signal according to an embodiment of the present invention.

Please refer to FIG. 1, in which a successive-approximation-register (SAR) analog-to-digital converter (ADC) 10 for programmably amplifying amplitude of an input signal includes a first node N1, a second node N2, a third node N3, a fourth node N4, a fifth node N5, a comparator 110, an SAR control circuit 130, a selection module 170 and a capacitor module 150.

The selection module 170 includes a plurality of switching units (hereinafter referred to as first switching units UA1, UA2 to UA(N−1) and second switching units UB1, UB2 to UB(N−1)) and two input switches (hereinafter referred to as a first switch SW1 and a second switch SW2). The capacitor module 150 includes a plurality of capacitors (hereinafter referred to as first capacitors CA1, CA2 to CA(N−1) and second capacitors CB1, CB2 to CB(N−1)). Here, the first capacitors CA1, CA2 to CA(N−1) are respectively corresponding to the first switching units UA1, UA2 to UA(N−1), and the second capacitors CB1, CB2 to CB(N−1) are respectively corresponding to the second switching units UB1, UB2 to UB(N−1), where N is a positive integer greater than 1. In some embodiments, the switching units and the capacitors form a switched-capacitor array (SCA).

Bottom plates of the first capacitors CA1, CA2 to CA(N−1) are coupled to the second node N2, the third node N3, the fourth node N4 and the fifth node N5 through the corresponding first switching units UA1, UA2 to UA(N−1). For example, the bottom plate of the first capacitor CA1 is coupled to the second node N2, the third node N3, the fourth node N4 and the fifth node N5 through the corresponding first switching unit UA1. That is to say, the first switching unit UA1 is coupled between the bottom plate of the first capacitor CA1 and the second node N2, between the bottom plate of the first capacitor CA and the third node N3, between the bottom plate of the first capacitor CA1 and the fourth node N4, and between the bottom plate of the first capacitor CA1 and the fifth node N5. Similarly, the bottom plate of the first capacitor CA2 is coupled to the second node N2, the third node N3, the fourth node N4 and the fifth node N5 through the corresponding first switching unit UA2. The rest may be deduced by analogy. The bottom plate of the first capacitor CA(N−1) is coupled to the second node N2, the third node N3, the fourth node N4 and the fifth node N5 through the corresponding first switching unit UA(N−1).

Bottom plates of the second capacitors CB1, CB2 to CB(N−1) are coupled to the first node N1, the third node N3, the fourth node N4 and the fifth node N5 through the corresponding second switching units UB1, UB2 to UB(N−1). For example, the bottom plate of the second capacitor CB1 is coupled to the first node N1, the third node N3, the fourth node N4 and the fifth node N5 through the corresponding second switching unit UB1. That is to say, the second switching unit UB1 is coupled between the bottom plate of the second capacitor CB1 and the first node N1, between the bottom plate of the second capacitor CB1 and the third node N3, between the bottom plate of the second capacitor CB1 and the fourth node N4, and between the bottom plate of the second capacitor CB1 and the fifth node N5. Similarly, the bottom plate of the second capacitor CB2 is coupled to the first node N1, the third node N3, the fourth node N4 and the fifth node N5 through the corresponding second switching unit UA2. The rest may be deduced by analogy. The bottom plate of the second capacitor CB(N−1) is coupled to the first node N1, the third node N3, the fourth node N4 and the fifth node N5 through the corresponding second switching unit UB(N−1).

In some embodiments, for the capacitance, the first capacitors CA1, CA2 to CA(N−1) are respectively corresponding to the second capacitors CB1, CB2 to CB(N−1). That is to say, the capacitance of a first capacitor CAj is equal to the capacitance of a second capacitor CBj. Moreover, the capacitance of the first capacitor CAj is equal to 2-fold capacitance of the first capacitor CA (j+1), while the capacitance of the second capacitor CBj is equal to 2-fold capacitance of the second capacitor CB(j+1), where j=1 to N−2.

A first input terminal IN1 of the comparator 110 is electrically coupled to one terminal of the first switch SW1 and top plates of the first capacitors CA1, CA2 to CA(N−1). A second input terminal IN2 of the comparator 110 is electrically coupled to one terminal of the second switch SW2 and top plates of the second capacitors CB1, CB2 to CB(N−1). An output terminal OUT of the comparator 110 is electrically coupled to an SAR control circuit 130. The other terminal of the first switch SW1 is electrically coupled to the first node N1, and the other terminal of the second switch SW2 is electrically coupled to the second node N2. In other words, the first switch SW1 is coupled between the first input terminal IN1 of the comparator 110 and the first node N1, while the second switch SW2 is coupled between the second input terminal IN2 of the comparator 110 and the second node N2.

The SAR control circuit 130 is coupled between the output terminal OUT of the S25 comparator 110 and a control terminal of the selection module 170, and generates first control signals ScA0 to ScA(N−1), second control signals ScB0 to ScB(N−1) and digital signals (digital codes B1 to BN) under control of a clock signal CK in according to an output of the comparator 130.

Here, the first node N1 is used to receive a positive input signal Vip, the second node N2 is used to receive an negative input signal Vin, the third node N3 is used to receive a positive reference voltage Vrp, the fourth node N4 is used to receive an negative reference voltage Vrn, and the fifth node N5 is used to receive a common-mode voltage Vcm. The positive input signal Vin and the negative input signal Vip are a differential input signal (Vi). The positive reference voltage Vrp and the negative reference voltage Vrn are a differential reference voltage (Vref).

In some embodiments, the capacitor module 150 further has a third capacitor CAN and a fourth capacitor CBN. The third capacitor CAN is coupled between the first input terminal IN1 of the comparator 110 and the fifth node N5. The fourth capacitor CBN is coupled between the second input terminal IN2 of the comparator 110 and the fifth node N5.

In some embodiments, for the capacitance, the third capacitor CAN is corresponding to the fourth capacitor CBN. That is to say, the capacitance of the third capacitor CAN is equal to the capacitance of the fourth capacitor CBN. Moreover, the capacitance of the third capacitor CAN is equal to the capacitance of the first capacitor CA(N−1), while the capacitance of the fourth capacitor CBN is equal to the capacitance of the second capacitor CB(N−1).

Figure 2:
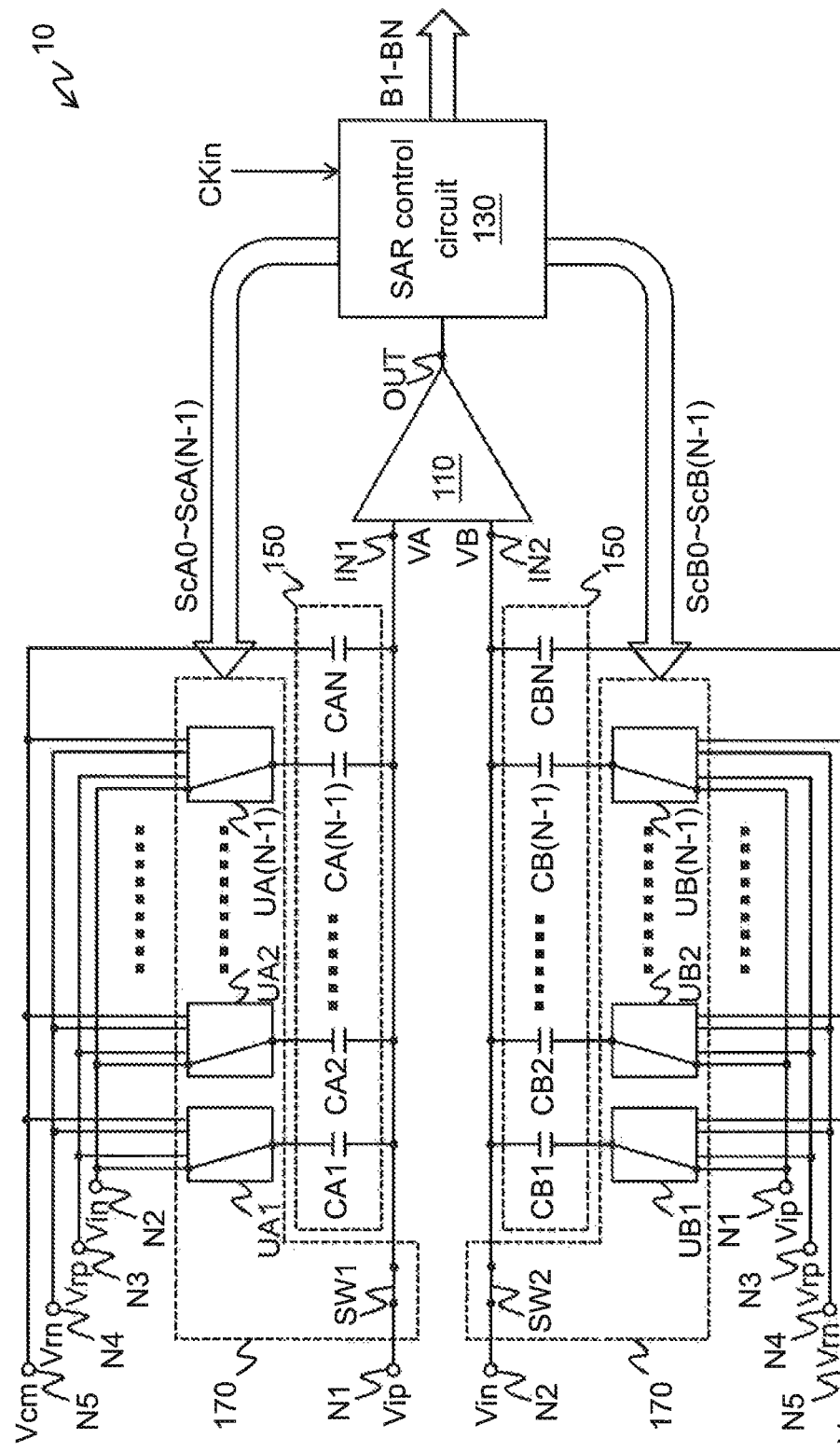
FIG. 2 is a schematic diagram of an exemplary state of the SAR ADC for programmably amplifying amplitude of an input signal in FIG. 1 during a sampling phase.

During the operation, the SAR ADC 10 first enters a sampling phase. Please refer to FIG. 2, in which during the sampling phase, the SAR control circuit 130 outputs the first control signals ScA1 to ScA(N−1) to control terminals of all the first switching units UA1, UA2 to UA(N−1), so that the first switching units UA1, UA2 to UA(N−1) electrically connect the bottom plates of the first capacitors CA1, CA2 to CA(N−1) to the second node N2 in response to the first control signals ScA1 to ScA(N−1) respectively.

The SAR control circuit 130 outputs the second control signals ScB1 to ScB(N−1) to the control terminals of all the second switching units UB1, UB2 to UB(N−1), so that the second switching units UB1, UB2 to UB(N−1) electrically connect the bottom plates of the second capacitors CB1, CB2 to CB(N−1) to the first node N1 in response to the second control signals ScB1 to ScB(N−1) respectively.

Additionally, the SAR control circuit 130 respectively outputs a first control signal ScA0 and a second control signal ScB0 to the control terminals of the first switch SW1 and the second switch SW2, so that the first switch SW1 electrically connects the top plates of the first capacitors CA1, CA2 to CA(N−1) to the first node N1 in response to the first control signal ScA0, while the second switch SW2 electrically connects the top plates of the second capacitors CB 1, CB2 to CB(N−1) to the second node N2 in response to the second control signal ScB0.

At this time, the top plates of the first capacitors CA1, CA2 to CA(N−1) and the bottom plates of the second capacitors CB1, CB2 to CB(N−1) receive the positive input signal Vip through the first node N1 and sample the positive input signal Vip. The bottom plates of the first capacitors CA1, CA2 to CA(N−1) and the top plates of the second capacitors CB1, CB2 to CB(N−1) receive the negative input signal Vin through the second node N2 and sample the negative input signal Vin.

Figure 3:
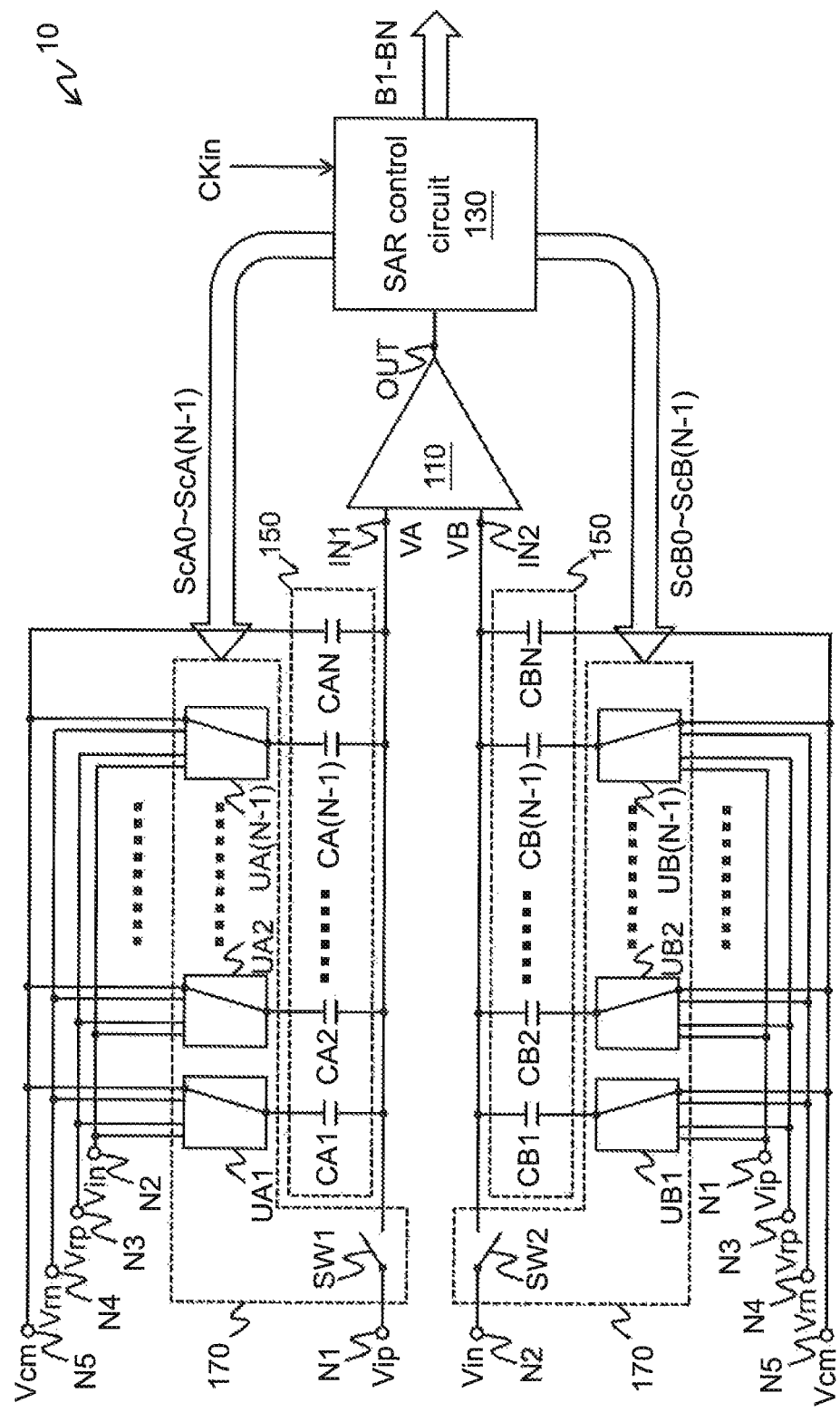
FIG. 3 is a schematic diagram of an exemplary state of the SAR ADC for programmably amplifying an amplitude of an input signal in FIG. 1 during first comparison of a holding phase and a bit-cycling phase.

Next, the SAR ADC 10 enters a holding phase from the sampling phase. Please refer to FIG. 3, in which during the holding phase, the SAR control circuit 130 outputs the first control signals ScA1 to ScA(N−1) to the control terminals of all the first switching units UA1, UA2 to UA(N−1), so that the first switching units UA1, UA2 to UA(N−1) switch the bottom plates of the first capacitors CA1, CA2 to CA(N−1) from being connected electrically to the second node N2 into being connected electrically to the fifth node N5 in response to the first control signals ScA1 to ScA(N−1) respectively.

The SAR control circuit 130 outputs the second control signals ScB1 to ScB(N−1) to the control terminals of all the second switching units UB1, UB2 to UB(N−1), so that the second switching units UB1, UB2 to UB(N−1) switch the bottom plates of the second capacitors CB1, CB2 to CB(N−1) from being connected electrically to the first node N1 into being connected electrically to the fifth node N5 in response to the second control signals ScB1 to ScB(N−1) respectively.

Additionally, the SAR control circuit 130 respectively outputs the first control signal ScA0 and the second control signal ScB0 to the control terminals of the first switch SW1 and the second switch SW2, so that the first switch SW1 disconnects the top plates of the first capacitors CA1, CA2 to CA(N−1) from the first node N1 in response to the first control signal ScA0, while the second switch SW2 disconnects the top plates of the second capacitors CB1, CB2 to CB(N−1) from the second node N2 in response to the second control signal ScB0.

Next, the SAR ADC 10 enters a bit-cycling phase from the holding phase. During the bit-cycling phase, the comparator 110 starts first comparison. At this time, the comparator 110 compares a terminal voltage VA (that is, the voltage received by the first input terminal IN1) of the top plates of the first capacitors CA1, CA2 to CA(N−1) with a terminal voltage VB (that is, the voltage received by the second input terminal IN2) of the top plates of the second capacitors CB1, CB2 to CB(N−1).

Next, the SAR control circuit 130 sets a digital code B1 of a first bit in a digital signal to be output according to an output of the comparator 110 (that is, a first comparison result of the terminal voltage VA and the terminal voltage VB) and generates the first control signals ScA1 to ScA (N−1) at the control terminals of the first switching units UA1, UA2 to UA(N−1) and generates the second control signals ScB1 to ScB(N−1) at the control terminals of the second switching units UB1, UB2 to UB(N−1) according to the output of the comparator 110, so that the first switching unit UA1 switches the bottom plate of the largest capacitor (that is, the first capacitor CA1) in the first capacitors CA1, CA2 to CA(N−1) from being connected electrically to the common-mode voltage Vcm into being connected electrically to one of the positive reference voltage Vrp and the negative reference voltage Vrn in response to the first control signal ScA1, while the second switching unit UB1 switches the bottom plate of one of the second capacitors CB1, CB2 to CB(N−1) corresponding to the first capacitor CA1 (that is, the largest second capacitor CB1) from being connected electrically to the common-mode voltage Vcm into being connected electrically to the other one of the positive reference voltage Vrp and the negative reference voltage Vrn in response to the second control signal ScB1. At this time, the bottom plates of the rest of the capacitors (the first capacitors CA2 to CA(N−1) and the second capacitors CB2 to CB(N−1)) remain unchanged, that is, being connected electrically to the common-mode voltage Vcm.

Figure 4:
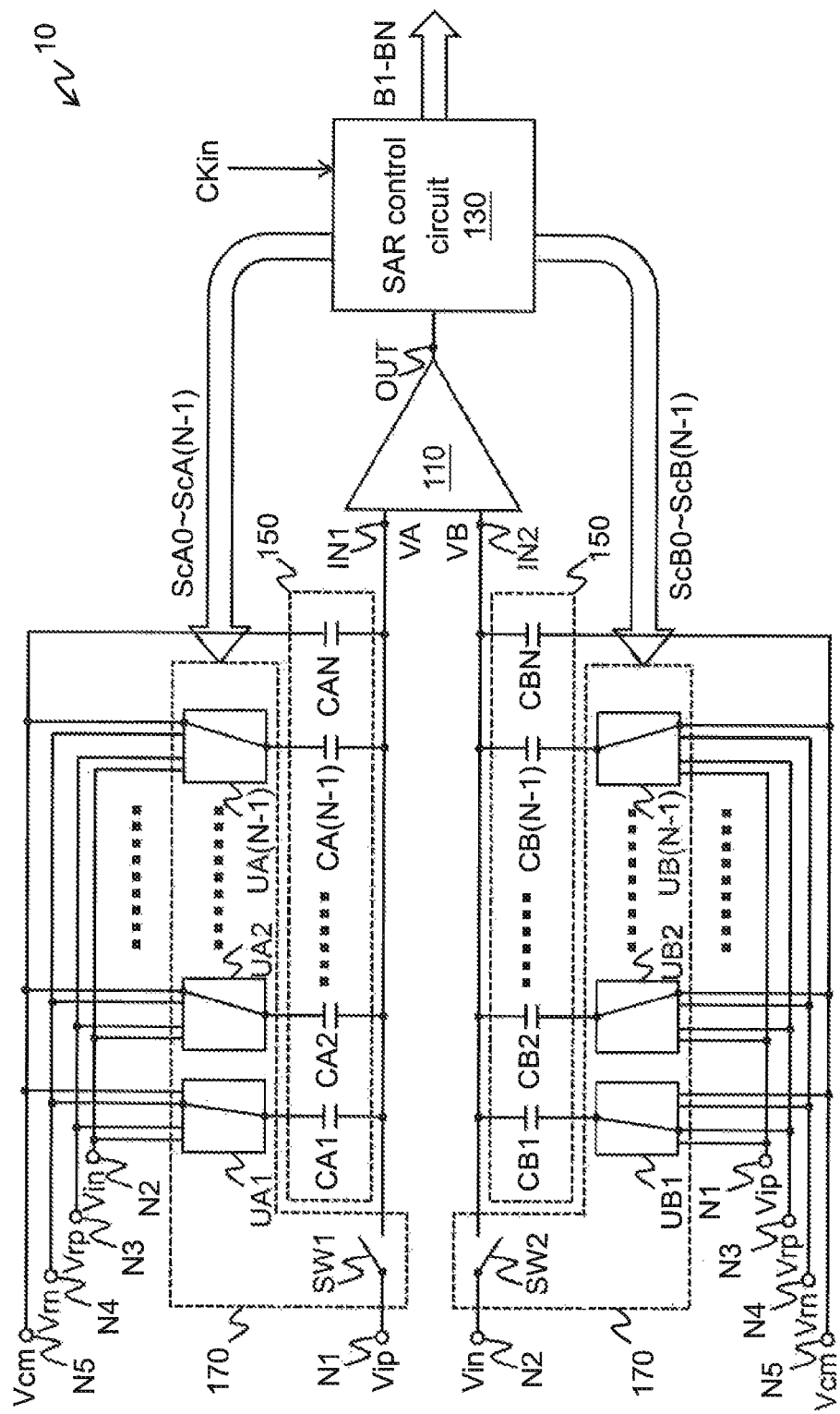
FIG. 4 is a schematic diagram of an exemplary state of the SAR ADC for programmably amplifying amplitude of an input signal in FIG. 1 during second comparison of the bit-cycling phase.

For example, Please refer to FIG. 4, when the terminal voltage VA is greater than the terminal voltage VB, the SAR control circuit 130 sets the digital code B1 of the first bit in the digital signal to be output to be 1, and controls the first switching unit UA1 to electrically connect the bottom plate of the first capacitor CA1 to the negative reference voltage Vrn and controls the second switching unit UB1 to electrically connect the bottom plate of the second capacitor CB1 to the positive reference voltage Vrp. Additionally, electrical connection relationships of the bottom plates of the rest of the capacitors remain unchanged.

Figure 5:
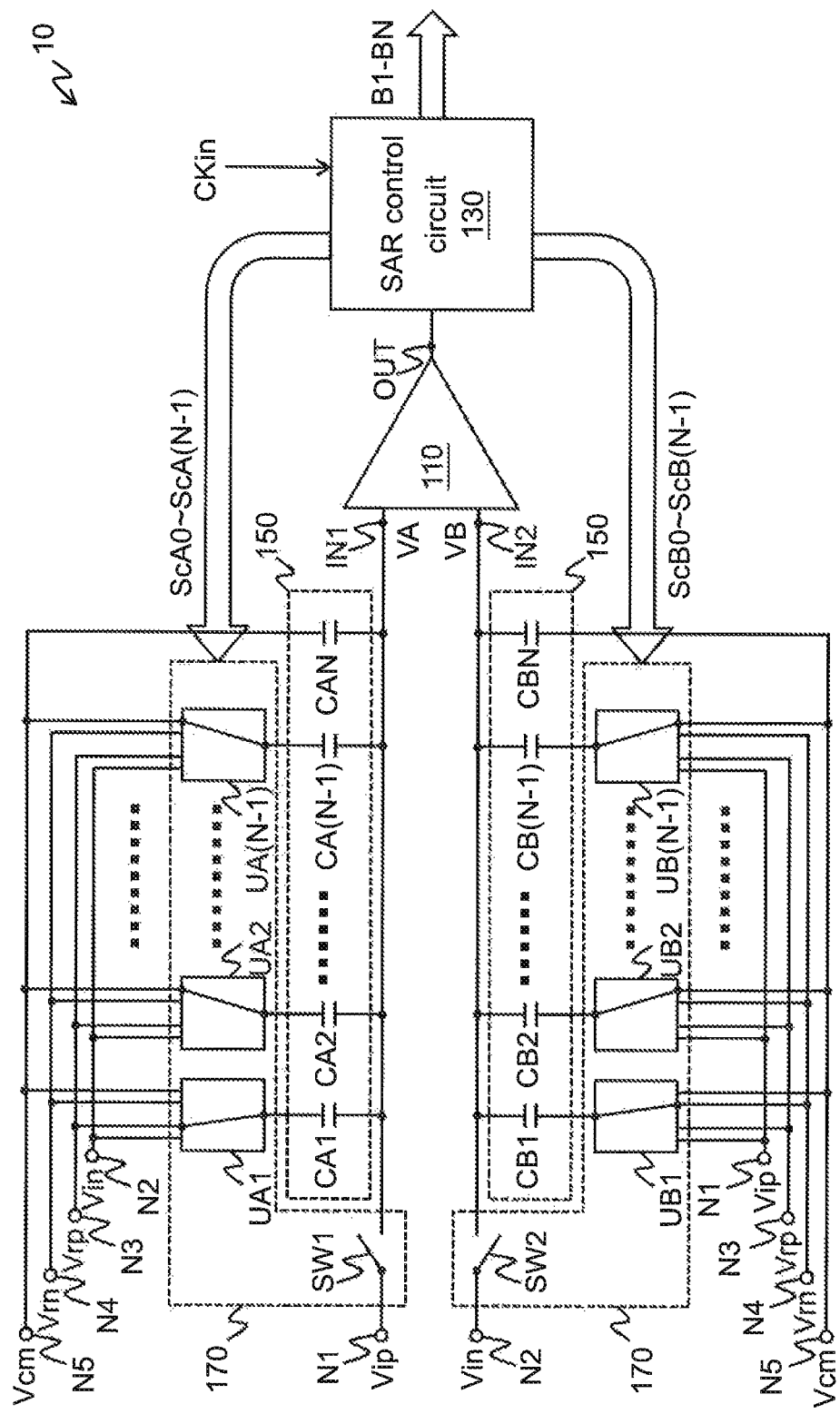
FIG. 5 is a schematic diagram of another exemplary state of the SAR ADC for programmably amplifying amplitude of an input signal in FIG. 1 during the second comparison of the bit-cycling phase.

Please refer to FIG. 5, in which when the terminal voltage VA is not greater than the terminal voltage VB, the SAR control circuit 130 sets the digital code B1 of the first bit in the digital signal to be output to be 0, and controls the first switching unit UA to electrically connect the bottom plate of the first capacitor CA 1 to the positive reference voltage Vrp and controls the second switching unit UB1 to electrically connect the bottom plate of the second capacitor CB1 to the negative reference voltage Vrn. Additionally, electrical connection relationships of the bottom plates of the rest of the capacitors remain unchanged.

Next, the comparator 110 again compares the terminal voltage VA of the top plates of the first capacitors CA1, CA2 to CA(N−1) with the terminal voltage VB of the top plates of the second capacitors CB1, CB2 to CB(N−1) (that is, performing second comparison).

Next, the SAR control circuit 130 again sets a digital code B2 of a second bit in the digital signal to be output according to the output of the comparator 110 (that is, a second comparison result of the terminal voltage VA and the terminal voltage VB), and generates the first control signals ScA 1 to ScA(N−1) at the control terminals of the first switching units UA 1, UA2 to UA(N−1) and generates the second control signals ScB1 to ScB(N−1) at the control terminals of the second switching unit UB1, UB2 to UB(N−1) according to the output of the comparator 110, so that the first switching unit UA2 switches the bottom plate of the second largest first capacitor CA2 in the first capacitors CA1, CA2 to CA(N−1) from being connected electrically to the common-mode voltage Vcm into being connected electrically to one of the positive reference voltage Vrp and the negative reference voltage Vrn in response to the first control signal ScA2, while the second switching unit UB2 switches the bottom plate of one of the second capacitors CB1, CB2 to CB(N−1) (that is, the second largest second capacitor CB2), corresponding to the first capacitor CA2 from being connected electrically to the common-mode voltage Vcm into being connected electrically to the other one of the positive reference voltage Vrp and the negative reference voltage Vrn in response to the second control signal ScB2. At this time, the bottom plates of the rest of the capacitors (the first capacitors CA1 and CA3 to CA(N−1) and the second capacitors CB1 and CB3 to CB(N−1)) remain unchanged. That is to say, the first capacitor CA1 and the second capacitor CB1 maintain respectively being connected electrically to the positive reference voltage Vrp and the negative reference voltage Vrn, while the first capacitors CA3 to CA(N−1) and the second capacitors CB3 to CB(N−1) maintain being connected electrically to the common-mode voltage Vcm.

Figure 6:
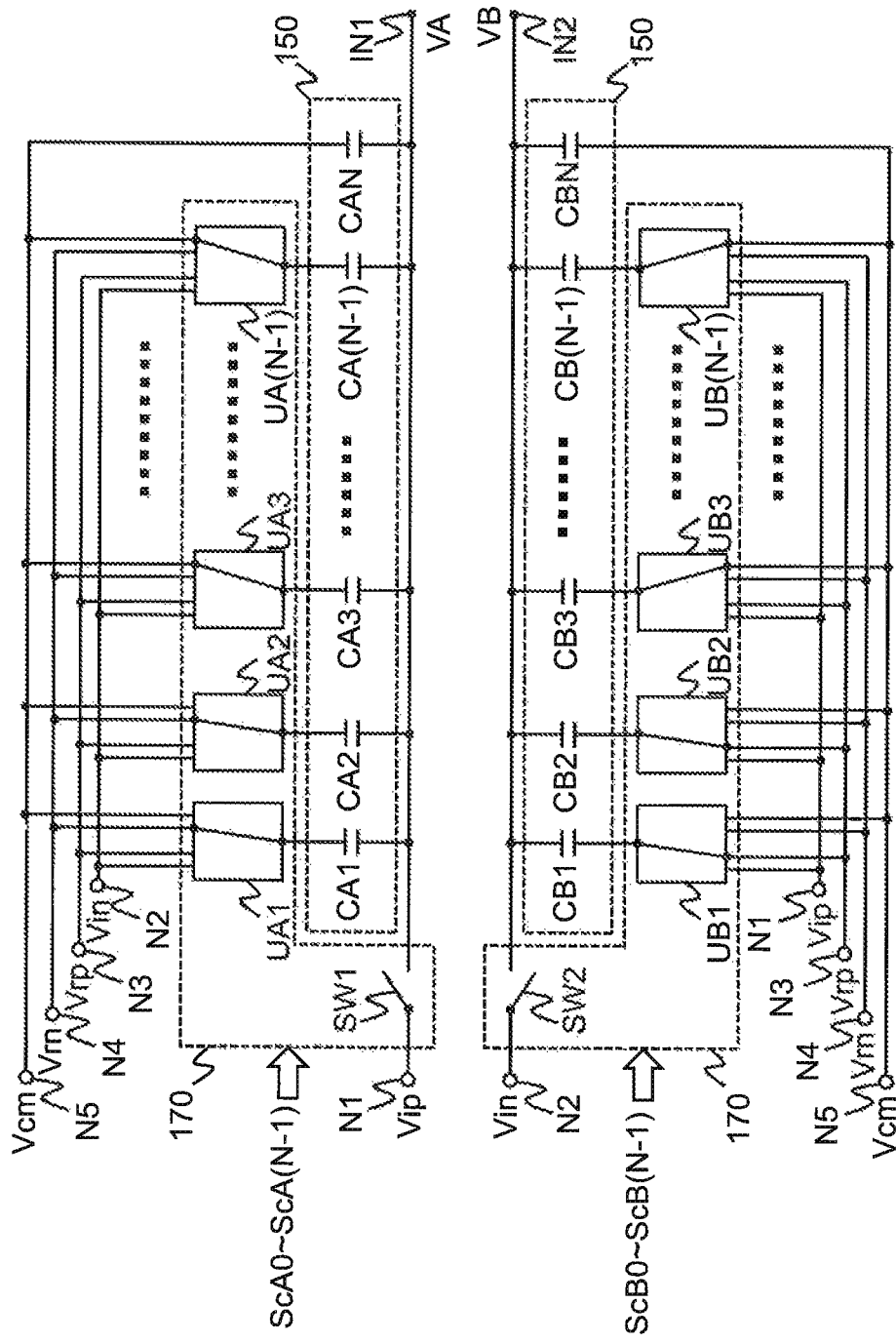
FIG. 6 is a partial schematic diagram of an exemplary state of the SAR ADC for programmably amplifying amplitude of an input signal in FIG. 1 during third comparison of the bit-cycling phase.

Here, similarly, please refer to FIG. 6, in which (here, assuming the first comparison result is that the terminal voltage VA is greater than the terminal voltage VB), when the terminal voltage VA is greater than the terminal voltage VB, the SAR control circuit 130 sets the digital code B2 of the second bit in the digital signal to be output to be 1, and controls the first switching unit UA2 to electrically connect the bottom plate of the first capacitor CA2 to the negative reference voltage Vrn and controls the second switching unit UB2 to electrically connect the bottom plate of the second capacitor CB2 to the positive reference voltage Vrp. Additionally, electrical connection relationships of the bottom plates of the rest of the capacitors remain unchanged.

Figure 7:
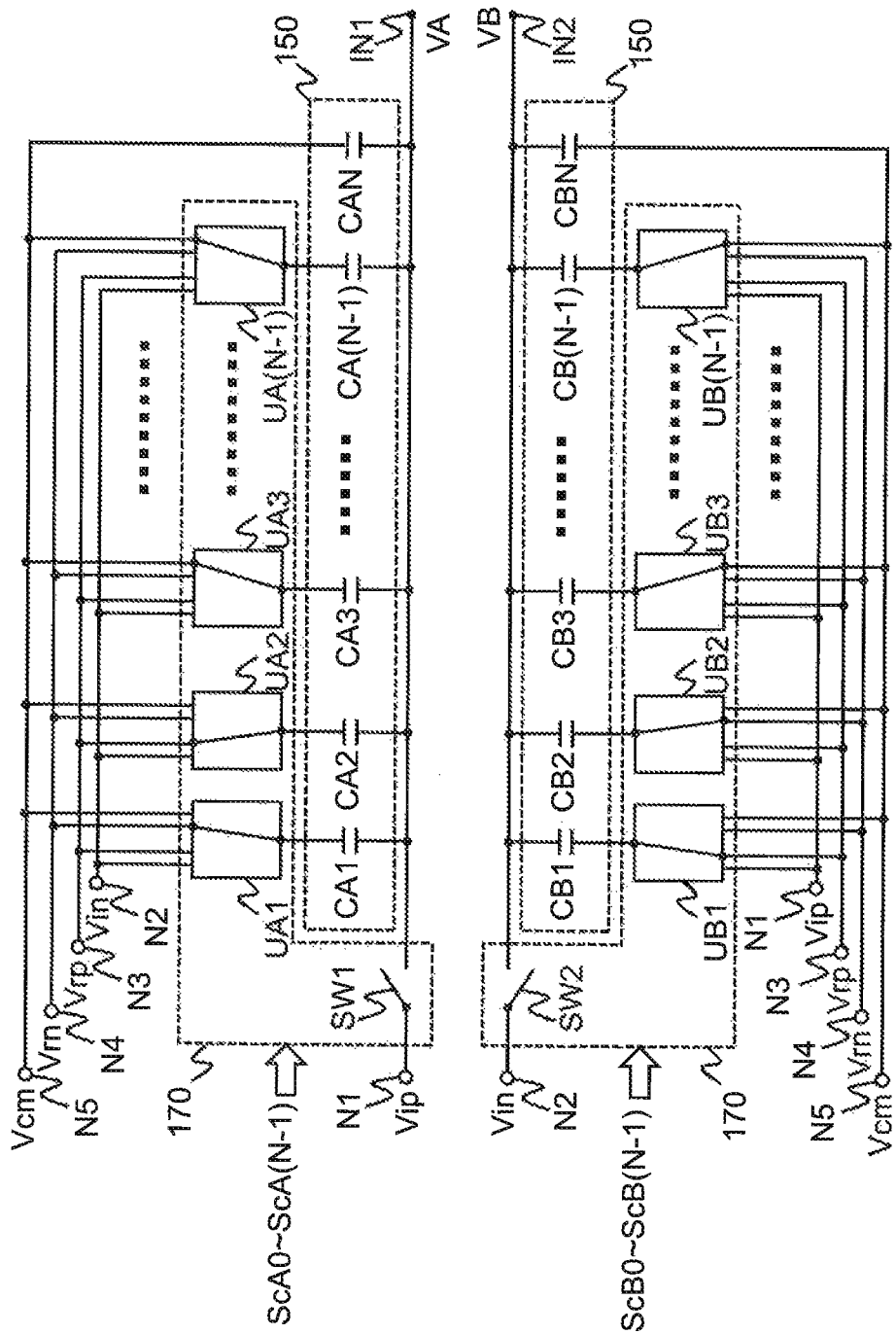
FIG. 7 is a partial schematic diagram of another exemplary state of the SAR ADC for programmably amplifying amplitude of an input signal in FIG. 1 during the third comparison of the bit-cycling phase.

Please refer to FIG. 7, in which (here, assuming the first comparison result is that the terminal voltage VA is greater than the terminal voltage VB), when the terminal voltage VA is not greater than the terminal voltage VB, the SAR control circuit 130 sets the digital code B2 of the second bit in the digital signal to be output to be 0, and controls the first switching unit UA2 to electrically connect the bottom plate of the first capacitor CA2 to the positive reference voltage Vrp and controls the second switching unit UB2 to electrically connect the bottom plate of the second capacitor CB2 to the negative reference voltage Vrn. Furthermore, the electrical connection relationships of the bottom plates of the rest of the capacitors remain unchanged.

In other words, each comparison result is sequentially corresponding to a first capacitor, sequentially corresponding to a second capacitor, and sequentially corresponding to one bit of a digital signal. Consequently, after each comparison, the SAR control circuit 130 sets the value of the digital code of the corresponding bit in the digital signal and controls voltage levels (that is, the electrical connection relationships), of the bottom plates of the corresponding first capacitor and the corresponding second capacitor according to the output of the comparator 110. Comparison, setting and control are performed repeatedly until the setting of a digital code BN of the last bit is completed.

After completing the setting of the digital code BN of the last bit, the SAR control circuit 130 outputs the digital signal (that is, all the set digital codes B1 to BN), to a next level.

In the embodiments, after the SAR ADC 10 completes the sampling, a differential voltage of the input terminal of the comparator 130 is 2(Vip−Vin), so amplitude of a signal input into the comparator 130 is 2-fold amplitude of a differential input signal (Vi). In other words, the SAR ADC 10 performs comparison after amplifying the amplitude of the input signal (Vi) by 2-fold. Moreover, in the SAR ADC 10 according to the present invention, after being sampled, a pseudo-differential input signal is automatically converted into a full differential input signal. For example, in the pseudo-differential input signal (the positive input signal Vip and the negative input signal Vin), the negative input signal Vin is always Vcmin, while the positive input signal Vip is Vcmin+ΔV. After the sampling is completed, an input voltage (the terminal voltage VA) of the first input terminal IN1 of the comparator 130 is Vcm+ΔV, while an input voltage (the terminal voltage VB) of the second input terminal IN2 of the comparator 130 is Vcm-ΔV.

Furthermore, only the bottom plates of a part of the capacitors may be selected to be connected electrically to the input signal, so as to decide amplification (between 1-fold and 2-fold) of the amplitude of the differential input signal (Vi).

Figure 8:
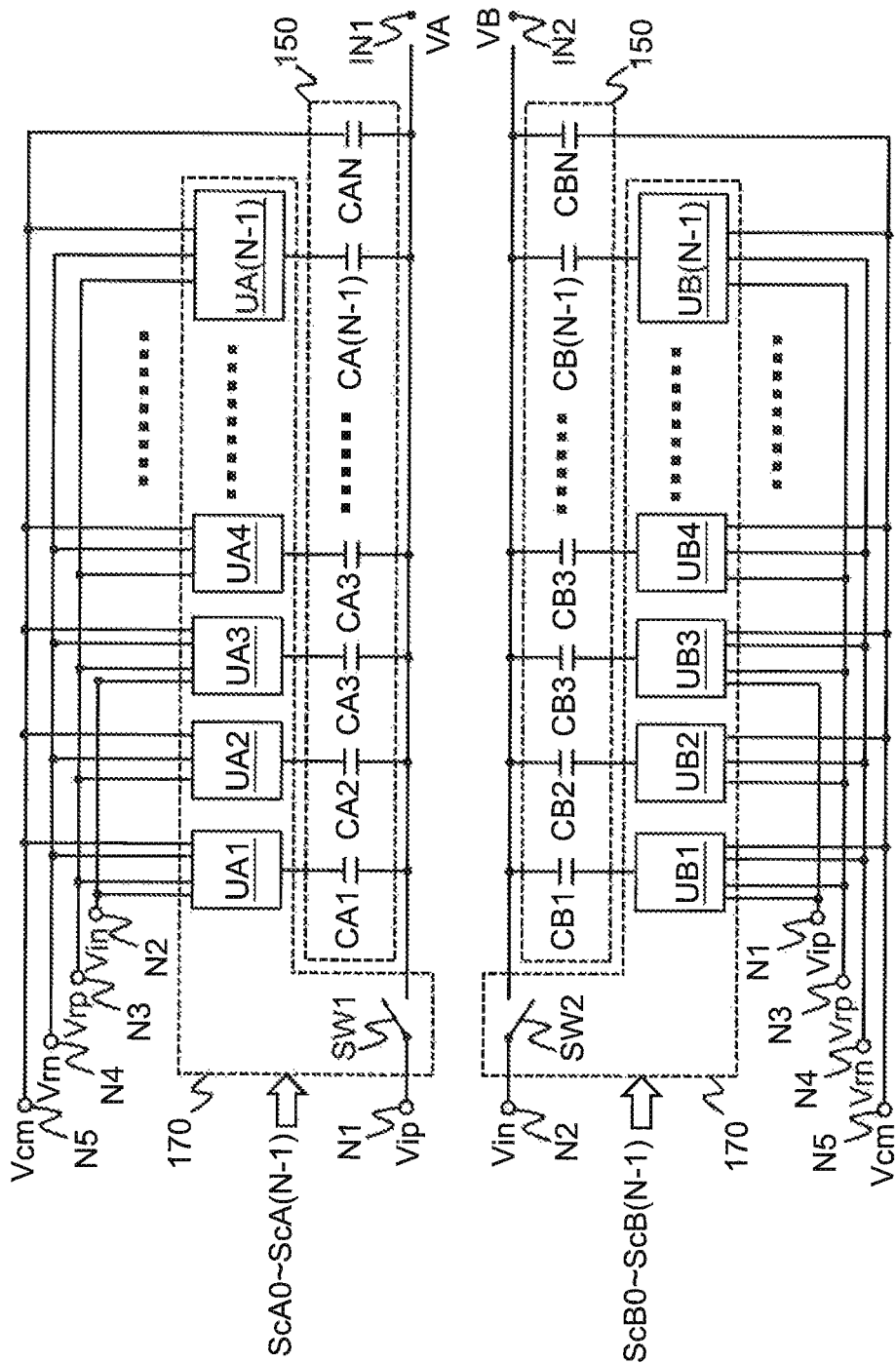
FIG. 8 is a partial schematic diagram of an SAR ADC for programmably amplifying amplitude of an input signal according to another embodiment of the present invention.

In some embodiments, please refer to FIG. 8, in which the bottom plates of the first capacitors CA1, CA2 to CA(N-1) are coupled to the third node N3, the fourth node N4 and the fifth node N5 through the corresponding first switching units UA1, UA2 to UA(N-1). The bottom plates of the second capacitors CB1, CB2 to CB(N-1) are coupled to the third node N3, the fourth node N4 and the fifth node N5 through the corresponding second switching units UB1, UB2 to UB(N-1).

The bottom plate of at least one of the first capacitors CA1, CA2 to CA(N-1) is further coupled to the second node N2 through the corresponding first switching unit, while the first switching units corresponding to the rest of the first capacitors are not coupled to the second node N2.

In some embodiments, the bottom plate of at least one of the second capacitors CB1, CB2 to CB(N-1) is further coupled to the first node N1 through the corresponding second switching unit, while the second switching units corresponding to the rest of the second capacitors are not coupled to the first node N1.

For example, in a structure of the SAR ADC 10 shown in FIG. 8, only two first capacitors CA1 and CA3 are coupled to the second node N2 through the corresponding first switching units UA1 and UA3, and two second capacitors CB1 and CB3 are coupled to the first node N1 through the corresponding second switching units UB1 and UB3. The switching units corresponding to the rest of the capacitors are not coupled to the first node N1 and the second node N2.

Figure 9:
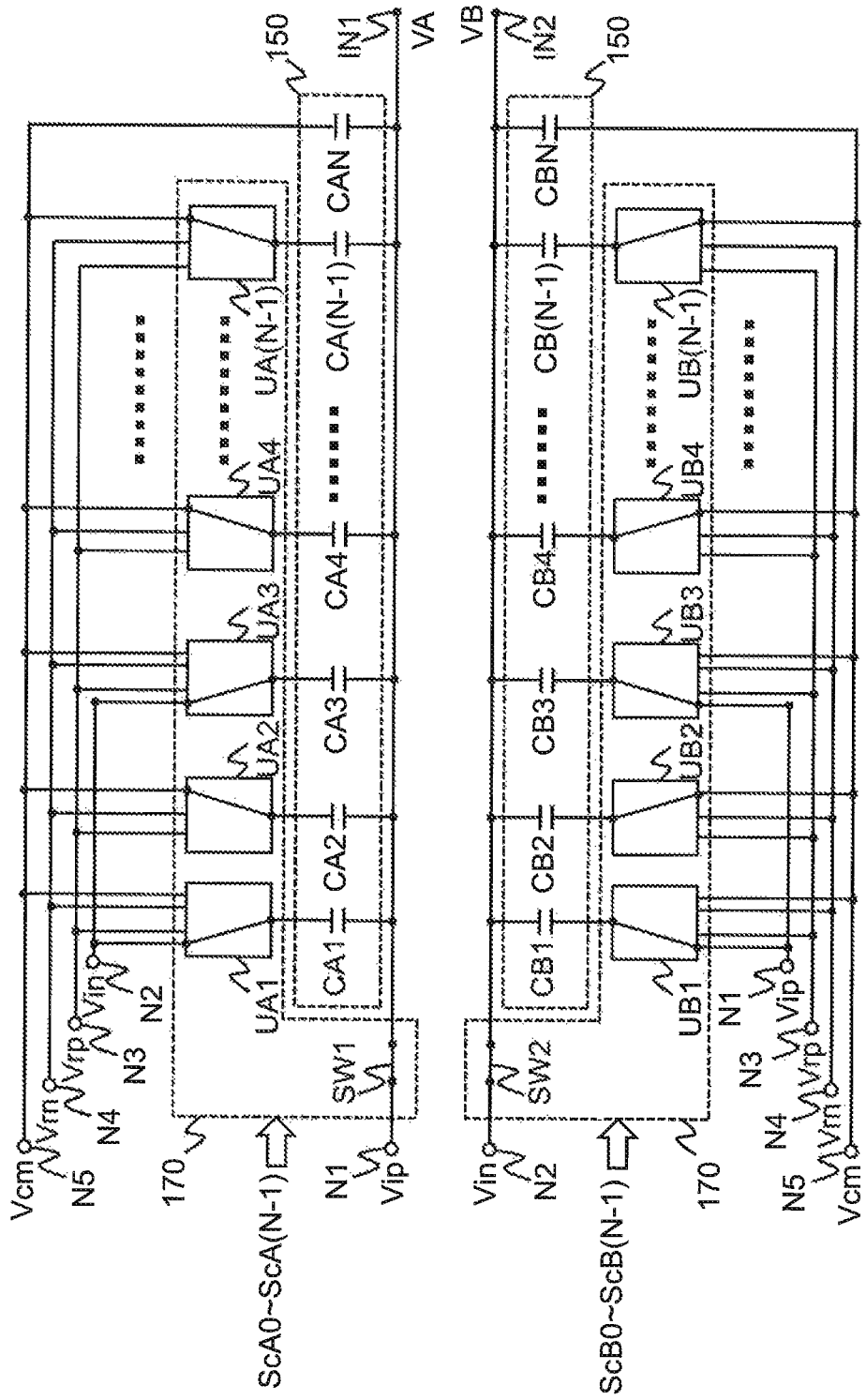
FIG. 9 is a partial schematic diagram of an exemplary state of the SAR ADC for programmably amplifying amplitude of an input signal in FIG. 8 during a sampling phase.

Here, Pplease refer to FIG. 9, in which during the sampling phase, the SAR control circuit 130 outputs first control signals ScA1 to ScA(N-1) to the control terminals of all the first switching units UA1, UA2 to UA(N-1), so that the first switching units UA1 and UA3 electrically connect the bottom plates of the first capacitors CA1 and CA3 to the second node N2 in response to the first control signals ScA 1 and ScA3 respectively, and the first switching units UA2, UA4 to UA(N-1) electrically connect the bottom plates of the first capacitors CA2, CA4 to CA(N-1) to the fifth node N5 in response to the first control signals ScA2, ScA4 to ScA(N-1) respectively.

At the same time, the SAR control circuit 130 outputs the second control signals ScB1 to ScB(N-1) to the control terminals of all the second switching units UB1, UB2 to UB(N-1), so that the second switching units UB1 and UB3 electrically connect the bottom plates of the second capacitors CB1 and CB3 to the first node N1 in response to the second control signals ScB1 and ScB3 respectively, and the second switching units UB2, UB4 to UB(N-1) electrically connect the bottom plates of the second capacitors CB2 and CB4 to CB(N-1) to the fifth node N5 in response to the second control signals ScB2, ScB4 to ScB(N-1) respectively.

Additionally, the SAR control circuit 130 respectively outputs the first control signal ScA0 and the second control signal ScB0 to the control terminals of the first switch SW1 and the second switch SW2, so that the first switch SW1 electrically connects the top plates of the first capacitors CA1, CA2 to CA(N-1) to the first node N1 in response to the first control signal ScA0, while the second switch SW2 electrically connects the top plates of the second capacitors CB1, CB2 to CB(N-1) to the second node N2 in response to the second control signal ScB0.

At this time, the top plates of the first capacitors CA1, CA2 to CA(N-1) receive the positive input signal Vip and sample the positive input signal Vip. The top plates of the second capacitors CB1, CB2 to CB(N-1) receive the negative input signal Vin through the second node N2 and sample the negative input signal Vin. Only the bottom plates of the first capacitors CA1 and CA3 receive the negative input signal Vin through the second node N2 and sample the negative input signal Vin, and the bottom plates of the second capacitors CB1 and CB3 receive the positive input signal Vip through the first node N1 and sample the positive input signal Vip. The bottom plates of the rest of the capacitors (the first capacitors CA2, CA4 to CA(N-1) and the second capacitors CB2 and CB4 to CB(N-1)) do not sample the input signal (the positive input signal Vip or the negative input signal Vin).

Figure 10:
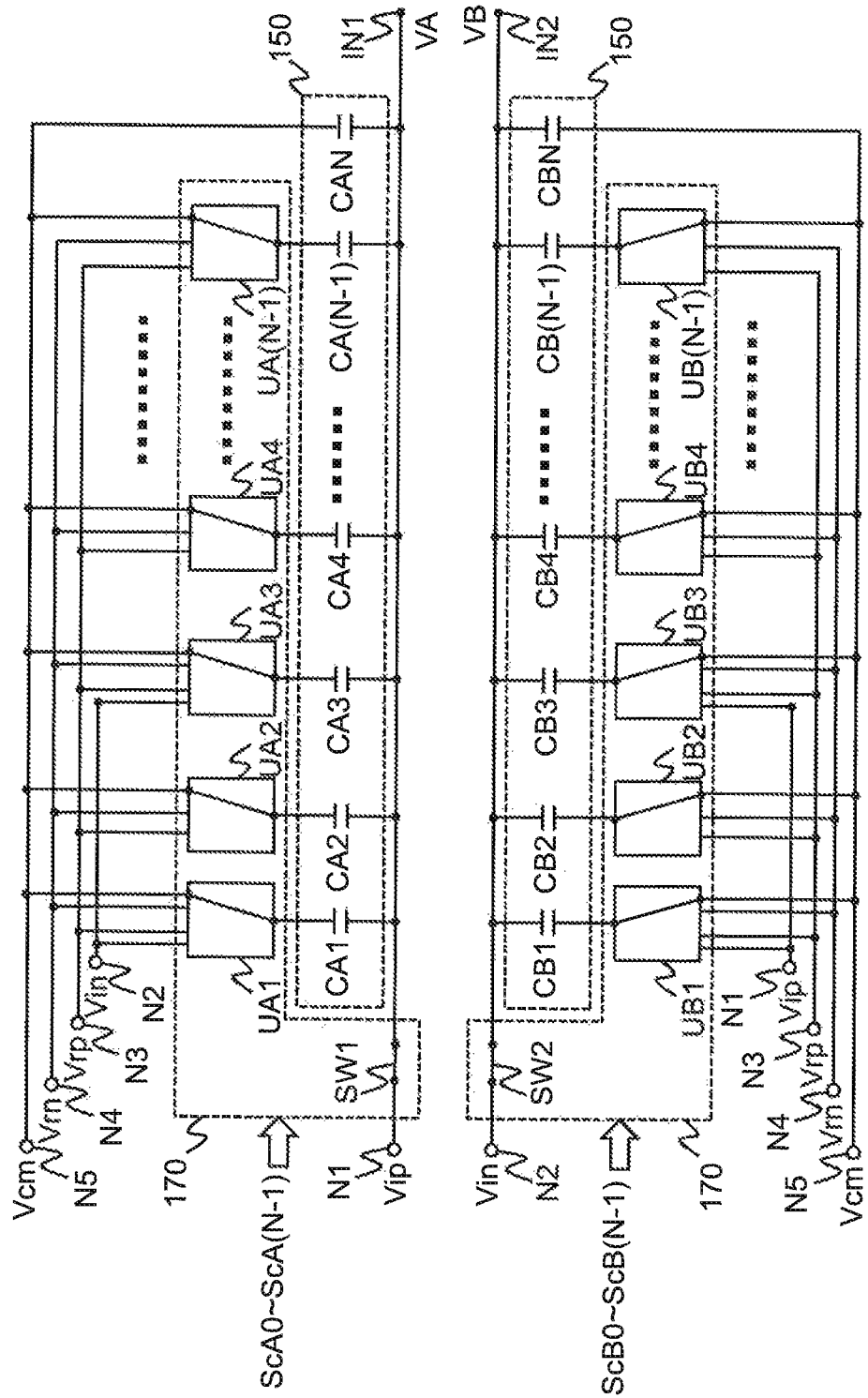
FIG. 10 is a partial schematic diagram of an exemplary state of the SAR ADC for programmably amplifying amplitude of an input signal in FIG. 8 during first comparis6n of a holding phase and a bit-cycling phase.

After the sampling is completed, please refer to FIG. 10, in which during the holding phase, under control of the SAR control circuit 130, the bottom plates of all the capacitors (the first capacitors CA1 to CA(N-1) and the second capacitors CB1 to CB(N-1)) are set to be connected electrically to the fifth node N5, and the top plates of all the capacitors are disconnected from the differential input signal (the positive input signal Vip or the negative input signal Vin).

During the bit-cycling phase, operations of the SAR ADC 10 are the same as those in the above embodiments, which are not repeated again herein.

In the architecture, after the SAR ADC 10 completes the sampling, the differential voltage of the input terminal of the comparator 130 is M(Vip-Vin), that is, the SAR ADC 10 can amplify the amplitude of the differential input signal by M-fold, where M is between 1 and 2.

Here, although the bottom plates of the corresponding first capacitor and second capacitor are used to sample the input signal, the present invention is not limited hereto. That is to say, the bottom plate of only one of the corresponding first capacitor and second capacitor can sample the input signal.

In other words, by adjusting, among the bottom plates, positions and the number of the capacitors for sampling the input signal, amplitudes of the differential input signals (Vi) with different amplification may be generated.

In some embodiments, each one of the first switching units UA1, UA2 to UA(N-1) and the second switching units UB1, UB2 to UB(N-1) (hereinafter referred to as a switching unit UB) is formed by a plurality of switches.

Figures 11, 12:
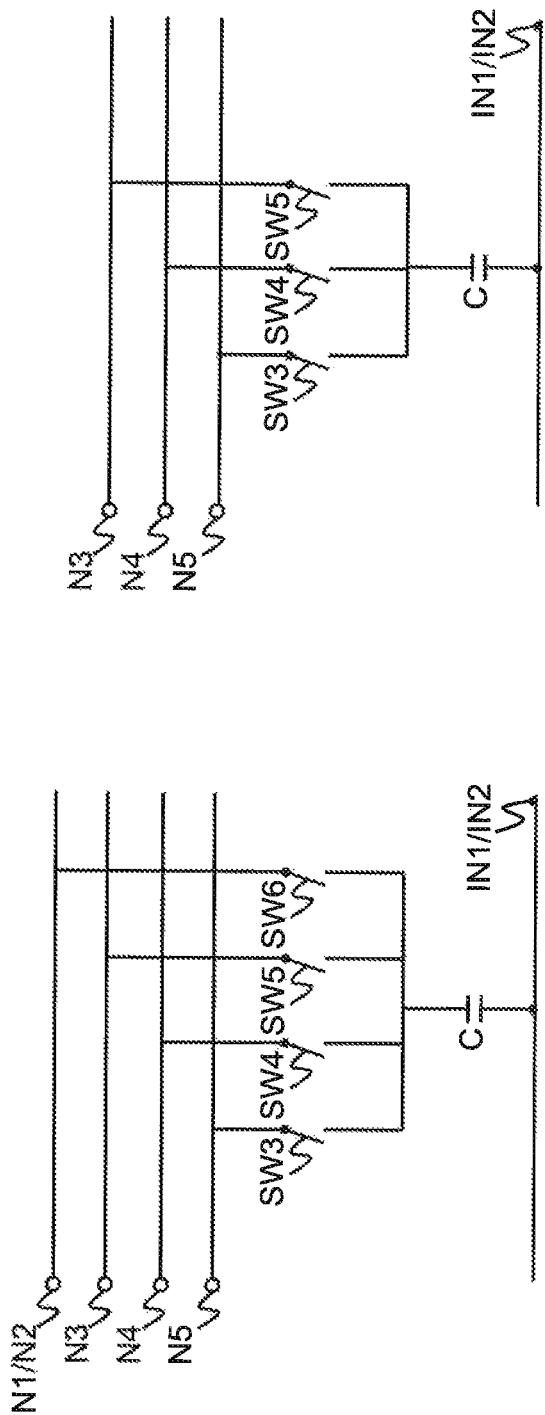
FIG. 11 is a schematic diagram of an exemplary structure of a switching unit.
FIG. 12 is a schematic diagram of another exemplary structure of the switching unit.

Please refer to FIG. 11, in which for a capacitor C (that is, one of the first capacitors CA1 to CA(N-1) and the second capacitors CB1 to CB(N-1)) whose bottom plate needs to sample an input signal, the corresponding switching unit UB may include four switches SW3, SW4, SW5 and SW6.

The switch SW3 is coupled between the fifth node N5 and the bottom plate of the capacitor C. The switch SW4 is coupled between the fourth node N4 and the bottom plate of the capacitor C. The switch SW5 is coupled between the third node N3 and the bottom plate of the capacitor C. The switch SW6 is coupled between the first node N1 or the second node N2 and the bottom plate of the capacitor C.

Control terminals of the switches SW3, SW4, SW5 and SW6 are coupled to the SAR control circuit 130. In other words, ON/OFF of the switches SW3, SW4, SW5 and SW6 coupled to each capacitor is controlled by the corresponding control signal (that is, one of the first control signals ScA1 to ScA(N−1) and the second control signals ScB1 to ScB(N−1)).

Please refer to FIG. 12, in which for the capacitor C (that is, one of the first capacitors CA1 to CA(N−1) and the second capacitors CB1 to CB(N−1)) whose bottom plate does not need to sample the input signal, the corresponding switching unit UB does not need the switch SW6, that is, only includes three switches SW3, SW4 and SW5.

In some embodiments, the first control signals ScA0 to ScA(N−1) may be implemented by a single signal, or may be implemented by multiple signals. Similarly, the second control signals ScB0 to ScB(N−1) may be implemented by the single signal, or may be implemented by the multiple signals.

The structure and the operational principle of the SAR control circuit 130 are known by persons of skill in the art, which are not repeated again herein.

To summarize, in the SAR ADC for programmably amplifying amplitude of an input signal and the method thereof according to the present invention, during the sampling phase, the bottom plate of at least one capacitor in the capacitor array is connected electrically to the input signal, so that the capacitor array samples and amplifies the input signal, so as to lower a required sampling capacitor, or reduce generating of noise. In other words, in the SAR ADC for programmably amplifying amplitude of an input signal and the method thereof according to the present invention, the top and bottom plates of the capacitor are used to perform sampling at the same time, so the amplitude of the input signal can be amplified at the same time, so that in consideration of noise in the same level, the required sampling capacitor is smaller, or for the same sampling capacitor, the brought noise is lower. Also, after being sampled, a pseudo-differential input signal is automatically converted into a full differential input signal, so as to suppress power supply noise and common-mode noise.

The present invention is disclosed as the aforementioned embodiments, which are not intended to limit the present invention. Persons skilled in the art can make some variation and modification without departing from the spirit and scope of the present invention. Consequently, the patent protection scope of the present invention should be subject to the limitation of appended claims of this specification.

What is claimed is:

1. A successive-approximation-register (SAR) analog-to-digital converter (ADC) for programmably amplifying amplitude of an input signal, comprising:
a first node, for receiving one of a differential input signal;
a second node, for receiving the other one of the differential input signal;
a third node, for receiving a positive reference voltage;
a fourth node, for receiving an negative reference voltage;
a fifth node, for receiving a common-mode voltage;
a comparator, having a first input terminal, a second input terminal and an output terminal;
an SAR control circuit, coupled to the output terminal to generate a first control signal, a second control signal and a digital signal according to an output of the comparator;
a selection module, comprising:
a plurality of first switching units, controlled by the first control signal;
a plurality of second switching units, controlled by the second control signal;
a first switch, coupled between the first input terminal and the first node; and
a second switch, coupled between the second input terminal and the second node; and
a capacitor module, comprising:
a plurality of first capacitors, respectively corresponding to the first switching units, each coupled between the first input terminal and the corresponding first switching unit, wherein each of the first capacitors is coupled to the third node, the fourth node and the fifth node through the corresponding first switching unit, and at least one of the first capacitors is further coupled to the second node through the corresponding first switching unit; and
a plurality of second capacitors, respectively corresponding to the second switching units, each coupled between the second input terminal and the corresponding second switching unit, wherein each of the second capacitors is coupled to the third node, the fourth node and the fifth node through the corresponding second switching unit.

2. The SAR ADC for programmably amplifying amplitude of an input signal according to claim 1, wherein all of the first capacitors are coupled to the second node through the corresponding first switching unit.

3. The SAR ADC for programmably amplifying an amplitude of an input signal according to claim 2, wherein during a sampling phase, top plates of the first capacitors sample the one of the differential input signal, and bottom plates of the first capacitors sample the other one of the differential input signal.

4. The SAR ADC for programmably amplifying amplitude of an input signal according to claim 2, wherein all of the second capacitors are coupled to the first node through the corresponding second switching unit.

5. The SAR ADC for programmably amplifying amplitude of an input signal according to claim 4, wherein during a sampling phase, top plates of the second capacitors sample the other one of the differential input signal, and bottom plates of the second capacitors sample the one of the differential input signal.

6. The SAR ADC for programmably amplifying amplitude of an input signal according to claim 2, wherein at least one of the second capacitors is further coupled to the first node through the corresponding second switching unit.

7. The SAR ADC for programmably amplifying amplitude of an input signal according to claim 6, wherein during a sampling phase, top plates of the second capacitors sample the other one of the differential input signal, a bottom plate of the at least one of the second capacitors samples the one of the differential input signal, and bottom plates of the rest of the second capacitors receive the common-mode voltage.

8. The SAR ADC for programmably amplifying amplitude of an input signal according to claim 1, wherein all of the second capacitors are coupled to the first node through the corresponding second switching unit.

9. The SAR ADC for programmably amplifying amplitude of an input signal according to claim 8, wherein during a sampling phase, top plates of the second capacitors sample the other one of the differential input signal, and bottom plates of the second capacitors sample the one of the differential input signal.

10. The SAR ADC for programmably amplifying amplitude of an input signal according to claim 1, wherein at least one of the second capacitors is further coupled to the first node through the corresponding second switching unit.

11. The SAR ADC for programmably amplifying amplitude of an input signal according to claim 10, wherein during a sampling phase, top plates of the second capacitors sample the other one of the differential input signal, a bottom plate of the at least one of the second capacitors samples the one of the differential input signal, and bottom plates of the rest of the second capacitors receive the common-mode voltage.

12. The SAR ADC for programmably amplifying amplitude of an input signal according to claim 1, wherein the capacitor module further comprises:
a third capacitor, coupled between the first input terminal and the fifth node; and
a fourth capacitor, coupled between the second input terminal and the fifth node.

13. The SAR ADC for programmably amplifying amplitude of an input signal according to claim 1, wherein each one of the first switching units and the second switching units is formed by a plurality of switches.

14. The SAR ADC for programmably amplifying amplitude of an input signal according to claim 1, wherein during a sampling phase, top plates of the first capacitors sample the one of the differential input signal, a bottom plate of at least one of the first capacitors samples the other one of the differential input signal, and bottom plates of the rest of the first capacitors receive the common-mode voltage.

15. An successive-approximation-register (SAR) analog-to-digital conversion method for programmably amplifying amplitude of an input signal, comprising:
a sampling phase, comprising:
sampling one of a differential input signal by using top plates of a plurality of first capacitors in a capacitor module;
sampling the other one of the differential input signal by using a bottom plate of at least one of the first capacitors; and
sampling the other one of the differential input signal by using top plates of a plurality of second capacitors in the capacitor module, wherein the second capacitors are respectively corresponding to the first capacitors;
a holding phase after the sampling phase, comprising:
disconnecting the top plates of the first capacitors from the one of the differential input signal;
setting the bottom plates of the first capacitors to be connected electrically to a common-mode voltage; and
disconnecting the top plates of the second capacitors from the other one of the differential input signal; and
a bit-cycling phase after the holding phase, comprising:
comparing a terminal voltage of the top plates of the first capacitors with a terminal voltage of the top plates of the second capacitors by using a comparator;
switching, sequentially according to an output of the comparator, the bottom plate of one of the first capacitors and the bottom plate of the corresponding second capacitor from being connected electrically to the common-mode voltage into being respectively connected electrically to a differential reference voltage, and after each switching, comparing the terminal voltage of the top plates of the first capacitors with the terminal voltage of the top plates of the second capacitors by using the comparator again; and
generating a digital signal according to the outputs of the comparator.

16. The SAR analog-to-digital conversion method for programmably amplifying amplitude of an input signal according to claim 15, wherein the step of sampling the other one of the differential input signal by using the bottom plate of at least one of the first capacitors comprises:
electrically connecting the bottom plate of the at least one of the first capacitors to the other one of the differential input signal; and
electrically connecting the bottom plates of the rest of the first capacitors to the common-mode voltage.

17. The SAR analog-to-digital conversion method for programmably amplifying amplitude of an input signal according to claim 15, wherein the step of sampling the other one of the differential input signal by using the bottom plate of at least one of the first capacitors comprises:
electrically connecting the bottom plates of the first capacitors to the other one of the differential input signal.

18. The SAR analog-to-digital conversion method for programmably amplifying amplitude of an input signal according to claim 15, wherein the sampling phase further comprises: sampling the one of the differential input signal by using the bottom plate of at least one of the second capacitors; and the holding phase further comprises: setting the bottom plates of the second capacitors to be connected electrically to the common-mode voltage.

19. The SAR analog-to-digital conversion method for programmably amplifying amplitude of an input signal according to claim 18, wherein the step of sampling the one of the differential input signal by using the bottom plate of at least one of the second capacitors comprises:
electrically connecting the bottom plate of the at least one of the second capacitors to the one of the differential input signal; and
electrically connecting the bottom plates of the rest of the second capacitors to the common-mode voltage.

20. The SAR analog-to-digital conversion method for programmably amplifying amplitude of an input signal according to claim 18, wherein the step of sampling the one of the differential input signal by using the bottom plate of at least one of the second capacitors comprises:
electrically connecting the bottom plates of the second capacitors to the one of the differential input signal.

21. The SAR analog-to-digital conversion method for programmably amplifying amplitude of an input signal according to claim 15, wherein the capacitor module further comprises a third capacitor, coupled between a first input terminal of the comparator and the common-mode voltage, and a fourth capacitor, coupled between a second input terminal of the comparator and the common-mode voltage.

* * * * *